United States Patent
Kim et al.

(10) Patent No.: US 12,349,587 B2
(45) Date of Patent: Jul. 1, 2025

(54) DISPLAY SUBSTRATE AND MANUFACTURING METHOD THEREFOR, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Doyoung Kim, Beijing (CN); Benlian Wang, Beijing (CN); Weiyun Huang, Beijing (CN); Yue Long, Beijing (CN); Yudiao Cheng, Beijing (CN); Kaipeng Sun, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 490 days.

(21) Appl. No.: 17/789,150

(22) PCT Filed: Aug. 16, 2021

(86) PCT No.: PCT/CN2021/112657
§ 371 (c)(1),
(2) Date: Jun. 24, 2022

(87) PCT Pub. No.: WO2022/068429
PCT Pub. Date: Apr. 7, 2022

(65) Prior Publication Data
US 2023/0047280 A1    Feb. 16, 2023

(30) Foreign Application Priority Data
Sep. 30, 2020  (CN) .................. 202011057090.X

(51) Int. Cl.
*H10K 77/10*    (2023.01)
*H10K 50/844*    (2023.01)
(Continued)

(52) U.S. Cl.
CPC ........... *H10K 77/10* (2023.02); *H10K 50/844* (2023.02); *H10K 59/65* (2023.02);
(Continued)

(58) Field of Classification Search
CPC .... H10K 50/844; H10K 59/873; H10K 59/65; H10K 71/00; H10K 59/8723; H10K 77/10
See application file for complete search history.

(56) References Cited

U.S. PATENT DOCUMENTS 10,541,380 B1 *  1/2020  Sung .............. H10K 59/122
10,937,998 B1    3/2021  Zhang et al.
(Continued)

FOREIGN PATENT DOCUMENTS

CN    106887523 A    6/2017
CN    110265583 A    9/2019
(Continued)

OTHER PUBLICATIONS

CN 202011057090.X first office action.
(Continued)

*Primary Examiner* — Bac H Au
(74) *Attorney, Agent, or Firm* — IPro, PLLC

(57) ABSTRACT

Display substrate, manufacturing method therefor and display apparatus are provided. The display substrate includes a display area, the display area including a pixel region, a light transmissive region, and an isolation region between the pixel region and the light transmissive region and at least partially surrounding the light transmissive region; the isolation region includes an isolation component, a barrier wall
(Continued)

structure, and a groove structure located therebetween; the pixel region includes a light-emitting functional layer and an organic encapsulation layer; a portion of the light-emitting functional layer extending to the isolation region is disconnected at a side face of the isolation component; and the organic encapsulation layer extends from the pixel region to the isolation region, and the groove structure and the barrier wall structure is configured for limiting an extension of the organic encapsulation layer to the light transmissive region.

13 Claims, 4 Drawing Sheets

(51) Int. Cl.
 *H10K 59/65* (2023.01)
 *H10K 59/80* (2023.01)
 *H10K 71/00* (2023.01)
(52) U.S. Cl.
 CPC ....... *H10K 59/8723* (2023.02); *H10K 59/873* (2023.02); *H10K 71/00* (2023.02)

(56) References Cited

U.S. PATENT DOCUMENTS

| | | | | |
|---|---|---|---|---|
| 11,462,605 | B2* | 10/2022 | Han | H10K 50/844 |
| 2020/0052051 | A1 | 2/2020 | Lee et al. | |
| 2020/0127233 | A1 | 4/2020 | Sung et al. | |
| 2020/0176538 | A1* | 6/2020 | Um | H10K 59/121 |
| 2020/0176709 | A1* | 6/2020 | Moon | H10K 59/131 |
| 2020/0235180 | A1* | 7/2020 | Park | H10K 59/87 |
| 2020/0287164 | A1 | 9/2020 | Choi et al. | |
| 2021/0028249 | A1 | 1/2021 | Ding et al. | |
| 2021/0151707 | A1 | 5/2021 | Huang et al. | |
| 2021/0234122 | A1 | 7/2021 | Choi et al. | |
| 2021/0320276 | A1 | 10/2021 | Chang et al. | |
| 2022/0045300 | A1 | 2/2022 | He et al. | |
| 2022/0052134 | A1 | 2/2022 | Zhang et al. | |
| 2022/0077438 | A1 | 3/2022 | Wang et al. | |
| 2022/0310724 | A1 | 9/2022 | Hu et al. | |
| 2023/0146897 | A1 | 5/2023 | Han et al. | |
| 2024/0023365 | A1 | 1/2024 | Choi et al. | |

FOREIGN PATENT DOCUMENTS

| | | |
|---|---|---|
| CN | 110828687 A | 2/2020 |
| CN | 110854304 A | 2/2020 |
| CN | 110875440 A | 3/2020 |
| CN | 110890475 A | 3/2020 |
| CN | 111293148 A | 6/2020 |
| CN | 111312723 A | 6/2020 |
| CN | 112005378 A | 11/2020 |
| CN | 113875036 A | 12/2021 |
| CN | 114144886 A | 3/2022 |
| CN | 114203760 A | 3/2022 |
| IN | 111668261 A | 9/2020 |
| KR | 20200030163 A | 3/2020 |
| WO | 2020027404 A1 | 2/2020 |

OTHER PUBLICATIONS

PCT/CN2021/112657 international search report and written opinion.
CN 202011057090.X third office action.

* cited by examiner

DISPLAY SUBSTRATE AND MANUFACTURING METHOD THEREFOR, AND DISPLAY APPARATUS

CROSS-REFERENCE TO RELATED APPLICATIONS

The present application is the U.S. national phase of PCT Application No. PCT/CN2021/112657 filed on Aug. 16, 2021, which claims priority to Chinese Patent Application No. 202011057090.X filed in China on Sep. 30, 2020, the disclosure of which are hereby incorporated by reference in its entirety.

CROSS-REFERENCE TO RELATED APPLICATIONS

The present application claims priority to Chinese Patent Application No. 202011057090.X filed in China on Sep. 30, 2020, the disclosure of which are hereby incorporated by reference in its entirety.

TECHNICAL FIELD

The present disclosure relates to the technical field of display, and in particular, to a display substrate, a method for manufacturing the same, and a display device.

BACKGROUND

In order to improve a screen-to-body ratio of a display product, in the related art, a camera or the like is placed in a hole located in the display area of the display product, and a barrier structure is provided near an edge of the hole, so as to prevent an organic encapsulation material from overflowing and extending to the light transmissive region when performing a film encapsulation on the display product, which may affect the encapsulation performance of the display product. However, at present, when performing the film encapsulation, the organic encapsulation layer needs to cover a boundary of a side of the barrier structure away from the light transmissive region, which leads to a high risk in that the organic encapsulation material overflow from the barrier structure to the light transmissive region. This may easily affect the reliability of the display product.

SUMMARY

The present disclosure is to provide a display substrate, a method for manufacturing the same, and a display device.

In order to achieve this, the present disclosure provides the following technical solutions.

In a first aspect of the present disclosure, a display substrate is provided, including a display area, the display area including a pixel region, a light transmissive region, and an isolation region located between the pixel region and the light transmissive region, the isolation region at least partially surrounding the light transmissive region:
  where the isolation region includes an isolation component, a barrier wall structure, and a groove structure located between the isolation component and the barrier wall structure:
  the pixel region includes a light-emitting functional layer and an organic encapsulation layer: a portion of the light-emitting functional layer extending to the isolation region is disconnected at a side face of the isolation component; and the organic encapsulation layer extends from the pixel region to the isolation region, and the groove structure and the barrier wall structure are configured for limiting an extension of the organic encapsulation layer towards the light transmissive region.

Optionally, the isolation component includes at least two inner isolation components, the at least two inner isolation components are arranged at an interval in a direction from the pixel region towards the light transmissive region, and the at least two inner isolation components are located between the pixel region and the barrier wall structure; and
  the groove structure includes a first groove structure located between the at least two inner isolation components and the barrier wall structure, the organic encapsulation layer is filled in the first groove structure.

Optionally, the isolation component includes at least two outer isolation components, the at least two outer isolation components are arranged at an interval in a direction from the pixel region towards the light transmissive region, and the at least two outer isolation components are located between the light transmissive region and the barrier wall structure; and
  the groove structure includes a second groove structure located between the at least two outer isolation components and the barrier wall structure.

Optionally, a side face of an inner isolation component included in the isolation component has a recess, and/or a side face of an outer isolation component has a recess.

Optionally, the display substrate includes an interlayer insulating layer, and the interlayer insulating layer is located between the isolation component and a base of the display substrate: the interlayer insulating layer is provided with a channel, and an orthographic projection of the channel onto the base is located between orthographic projections of two adjacent outer isolation components onto the base; and/or, in a case that the isolation component includes the at least two inner isolation components, the orthographic projection of the channel onto the base is located between orthographic projections of two adjacent inner isolation components onto the base.

Optionally, the isolation region is provided with a first gate insulating layer, a second gate insulating layer and an interlayer insulating layer which are sequentially arranged in a stack in the direction away from a base of the display substrate; and a depth of the groove structure is greater than or equal to a thickness of the interlayer insulating layer in a direction perpendicular to the base.

Optionally, the barrier wall structure includes a first barrier wall component and a second barrier wall component arranged sequentially along a direction from the pixel region towards the light transmissive region, a height of a surface of the first barrier wall component facing away from a base of the display substrate is lower than a height of a surface of the second barrier wall component facing away from the base.

Optionally, the pixel region is provided with a planarization layer, a pixel definition layer and a spacer layer which are sequentially arranged in a stack in a direction away from the base:
  the first barrier wall component includes a first barrier wall pattern and a second barrier wall pattern which are sequentially arranged in a stack in the direction away from the base, the first barrier wall pattern is arranged in the same layer and made of the same material as the pixel definition layer, and the second barrier wall pattern is arranged in the same layer and made of the same material as the spacer layer; and the second barrier wall component includes a third barrier wall pattern, a fourth barrier wall pattern and a fifth barrier wall pattern which are sequentially arranged in a stack in the direction away from the base, the third barrier wall pattern is arranged in the same layer and made of the same material as the planarization layer, the fourth barrier wall pattern is arranged in the same layer and made of the same material as the pixel definition layer, and the fifth barrier wall pattern is arranged in the same layer and made of the same material as the spacer layer.

Optionally, the pixel region is provided with a planarization layer, a pixel definition layer and a spacer layer which are sequentially arranged in a stack in a direction away from a base of the display substrate; and the barrier wall structure includes a second barrier wall component, the second barrier wall component includes a third barrier wall pattern, a fourth barrier wall pattern and a fifth barrier wall pattern which are sequentially arranged in a stack in a direction away from the base, the third barrier wall pattern is arranged in the same layer and made of the same material as the planarization layer, the fourth barrier wall pattern is arranged in the same layer and made of the same material as the pixel definition layer, and the fifth barrier wall pattern is arranged in the same layer and made of the same material as the spacer layer.

Optionally, the groove structure encloses the light transmissive region.

Optionally, in a direction perpendicular to a base of the display substrate, a ratio of a depth of the groove structure to a height of the isolation component is in a range between 0.5 and 1.

In a second aspect of the present disclosure, on the basis of the technical solution of the display substrate described above, a display device is provided, including the display substrate described above.

In a third aspect of the present disclosure, on the basis of the technical solution of the display substrate described above, a method for manufacturing a display substrate is provided, the display substrate including a display area, the display area including a pixel region, a light transmissive region, and an isolation region between the pixel region and the light transmissive region, the isolation region at least partially surrounding the light transmissive region: the method including:

fabricating, in the isolation region, an isolation component, a barrier wall structure, and a groove structure located between the isolation component and the barrier wall structure:

fabricating a light-emitting functional layer and an organic encapsulation layer in the pixel region: where a portion of the light-emitting functional layer extending to the isolation region is disconnected at a side face of the isolation component: the organic encapsulation layer extends from the pixel region to the isolation region, and the groove structure and the barrier wall structure are configured for limiting an extension of the organic encapsulation layer towards the light transmissive region.

Optionally, the pixel region is provided with a planarization layer, a pixel definition layer and a spacer layer which are sequentially arranged in a stack in a direction away from a base of the display substrate; and the barrier wall structure includes a second barrier wall component, and the second barrier wall component includes a third barrier wall pattern, a fourth barrier wall pattern and a fifth barrier wall pattern which are sequentially arranged in a stack in a direction away from the base; and the method includes a step of fabricating the second barrier wall component, including:

forming, in a single patterning process, the third barrier wall pattern and the planarization layer simultaneously;

forming, in a single patterning process, the fourth barrier wall pattern and the pixel definition layer simultaneously; and forming, in a single patterning process, the fifth barrier wall pattern and the spacer layer simultaneously.

BRIEF DESCRIPTION OF THE DRAWINGS

The accompanying drawings illustrated here are to provide a further understanding of the present disclosure and constitute a portion of the present disclosure, exemplary embodiments of the present disclosure and description therefor serve to explain the disclosure and do not constitute an undue limitation to the disclosure. In the drawings.

DETAILED DESCRIPTION

In order to further explain the display substrate, the method for manufacturing the same, and the display device provided by embodiments of the present disclosure, a detailed description will be given hereinafter in conjunction with the accompanying drawings.

Figure 1:
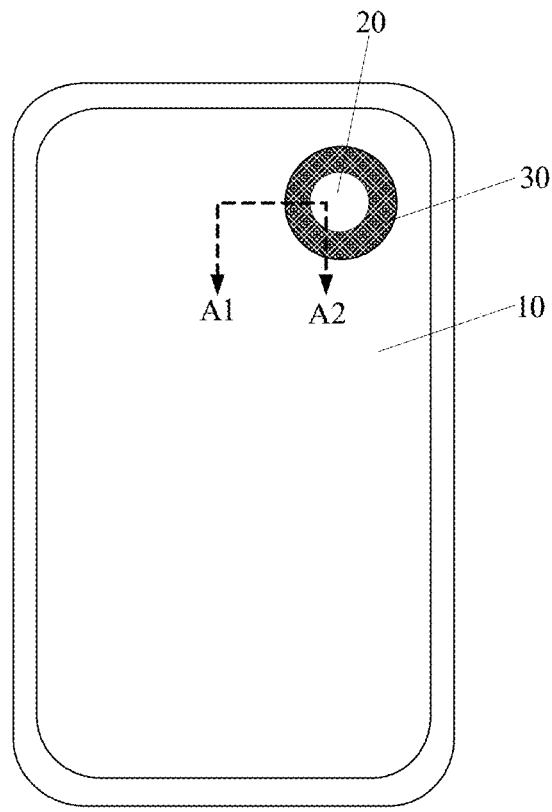
FIG. 1 is a schematic view showing a structure of a display substrate according to an embodiment of the present disclosure.
Figure 2:
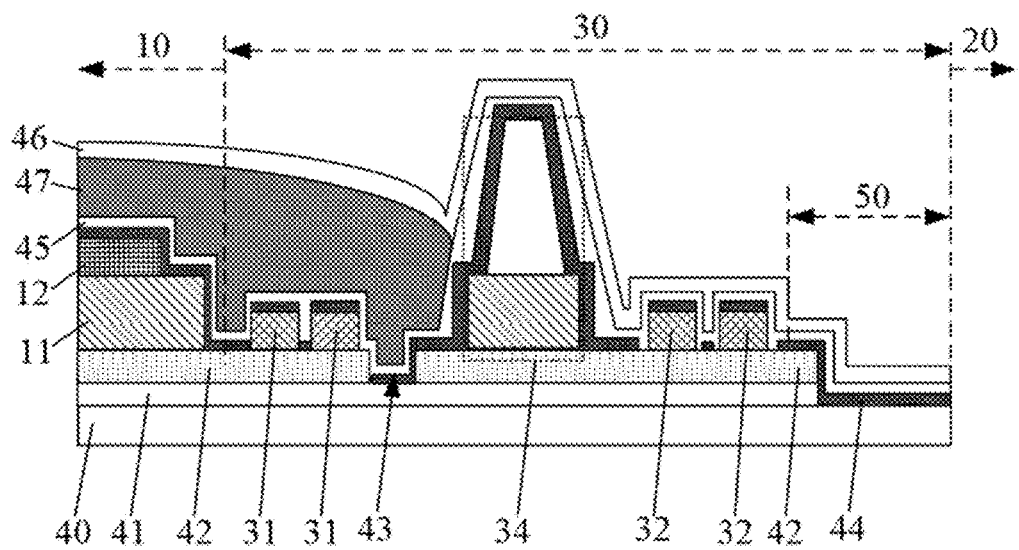
FIG. 2 is a first schematic cross-sectional view taken along a direction A1-A2 in FIG. 1.
Figure 6:
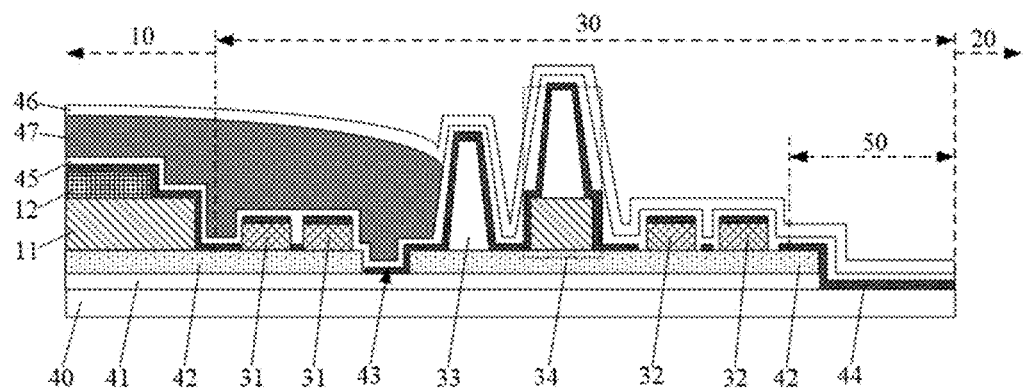
FIG. 6 is a fifth schematic cross-sectional view taken along the direction A1-A2 in FIG. 1.

Referring to FIGS. 1, 2, and 6, an embodiment of the present disclosure provides a display substrate, including a display area, the display area including a pixel region 10, a light transmissive region 20, and an isolation region 30 located between the pixel region 10 and the light transmissive region 20, the isolation region 30 at least partially surrounds the light transmissive region 20: the isolation region 30 includes an isolation component (such as inner isolation component(s) 31 and outer isolation component(s) 32) and a barrier wall structure (such as a first barrier wall component 33 and a second barrier wall component 34), and a groove structure located between the isolation component and the barrier wall structure: the pixel region 10 includes a light-emitting functional layer 44 and an organic encapsulation layer 47: a portion of the light-emitting functional layer 44 extending to the isolation region 30 is disconnected at a side face of the isolation component; and the organic encapsulation layer 47 extends from the pixel region 10 to the isolation region 30, and the groove structure and the barrier wall structure are configured for preventing the organic encapsulation layer 47 from extending to the light transmissive region 20.

Specifically, the display substrate includes the display area and a peripheral area surrounding the display area, where the display area includes the pixel region 10, the light transmissive region 20, and the isolation region 30 located between the pixel region 10 and the light transmissive region 20, the isolation region 30 is arranged to surround the light transmissive region 20, the pixel region 10 is arranged to surround the isolation region 30.

A specific position of the light transmissive region 20 may be set according to actual needs. Illustratively, the display substrate includes a rectangular display area, and the light transmissive region 20 is located at an upper left corner or an upper right corner of the rectangular display area. Illustratively, the shape of the light transmissive region 20 may be a regular shape such as a circle or a rectangle.

A base 40 of the display substrate includes a flexible base, and illustratively, includes a flexible polyimide (PI) base. When forming the light transmissive region 20, the base 40, as well as film layer(s) on the base 40, corresponding to the light transmissive region 20 may be removed.

The light-emitting functional layer 44 is located at a side of the isolation component and the barrier wall structure facing away from the base 40, and the light-emitting functional layer 44 includes at least an organic light-emitting material layer, and the organic light-emitting material layer includes an organic light-emitting material layer in a full layer which is configured for emitting white light, or an organic light-emitting material layer pattern configured for emitting color light (such as red light, green light, blue light, etc.). Further, the light-emitting functional layer 44 may include, in addition to the organic light-emitting material layer, a common layer with a full-layer structure such as an election transporting layer (ETL), an election injection layer (EIL), a hole transporting layer (HTL) and a hole injection layer (HIL). The light-emitting functional layer 44 is capable of covering the pixel region 10 and the isolation region 30, and is capable of extending to a boundary of the light transmissive region 20.

The display substrate further includes an encapsulation structure, and the encapsulation structure generally includes a first inorganic encapsulation layer 45, an organic encapsulation layer 47 and a second inorganic encapsulation layer 46 which are sequentially arranged in a stack in a direction away from the base 40; and the first inorganic encapsulation layer 45 and the second inorganic encapsulation layer 46 can fully cover an entire area of the display substrate. Illustratively, the first inorganic encapsulation layer 45 and the second inorganic encapsulation layer 46 may both be made using chemical vapor deposition. The organic encapsulation layer 47 may be fabricated with an ink-jet printing process. The groove structure and the barrier wall structure are used for limiting an overflow of the organic encapsulation material for fabricating the organic encapsulation layer 47 during fabrication of the organic encapsulation layer 47.

According to the above-mentioned specific structure of the display substrate, it can be seen that in the display substrate provided by embodiments of the present disclosure, the portion of the light-emitting functional layer 44 extending to the isolation region 30 is disconnected at side face(s) of the isolation component, thereby preventing water and oxygen from entering into the display substrate along the light-emitting functional layer 44. Furthermore, in the display substrate provided by embodiments of the present disclosure, the barrier wall structure can block the organic encapsulation material for forming the organic encapsulation layer 47 when forming the organic encapsulation layer 47. In addition, when the groove structure is located at a side of the barrier structure near the pixel region 10, the groove structure can accommodate a part of the organic encapsulation material, and when the groove structure is located at a side of the barrier structure near the light transmissive region 20, the groove structure can accommodate a part of the overflowed organic encapsulation material if the organic encapsulation material overflows from the barrier structure. Therefore, in the display substrate provided by embodiments of the present disclosure, by providing the groove structure and the barrier structure in the isolation region 30, both the groove structure and the barrier wall structure can effectively limit the extension of the organic encapsulation layer 47 towards the light transmissive region 20, thereby limiting an boundary of the organic encapsulation layer 47 within the isolation region 30. This can address the following issue: the organic encapsulation material may easily overflow from the barrier structure to the light transmissive region 20 when performing the thin film encapsulation, which may affect the reliability of the display product.

As shown in FIGS. 2, 3, 5, 6, 8, and 9, in some embodiments, the isolation component includes at least two inner isolation components 31, the at least two inner isolation components 31 are disposed sequentially in a direction from the pixel region 10 pointing towards the light transmissive region 20 and spaced apart from each other, and the at least two inner isolation components 31 are located between the pixel region 10 and the barrier wall structure; and the groove structure includes a first groove structure 43 located between the at least two inner isolation components 31 and the barrier wall structure, the organic encapsulation layer 47 is filled in the first groove structure 43.

Illustratively, in a direction perpendicular to the base, the height of the inner isolation component ranges from 5000 Å (Angstrom) to 10000 Å, inclusive.

Illustratively, each inner isolation component 31 surrounds the light transmissive region 20.

Illustratively, the first groove structure 43 is located between an entire structure including the at least two inner isolation components 31 and the barrier wall structure.

Illustratively, the width of the first groove is less than the distance between the entire structure including the at least two inner isolation components 31 and the barrier wall structure.

Illustratively, the width of the first groove ranges from 10 μm to 20 μm, inclusive, and may be, for example, 12 μm, 14 μm, 16 μm, or 18 μm, etc.

Illustratively, the depth of the first groove ranges from 5000 Å to 10000 Å, inclusive, and may be, for example, 6000 Å, 7000 Å, 8000 Å, or 9000 Å, etc.

In the display substrate provided by the above-mentioned embodiment, by arranging the groove structure to include the first groove structure 43 located between the at least two inner isolation components 31 and the barrier wall structure, the space for storing the organic encapsulation material at the side of the barrier wall structure away from the light transmissive region 20 can be increased, while ensuring that the organic encapsulation layer 47 can fully cover the at least two inner isolation components 31, and that the inner isolation components 31 are effective, thereby effectively reducing the risk for the organic encapsulation material overflowing out of the barrier wall structure.

As shown in FIGS. 4 to 8, in some embodiments, the isolation component includes at least two outer isolation components 32, the at least two outer isolation components 32 are disposed sequentially in the direction from the pixel region 10 pointing towards the light transmissive region 20 and spaced apart from each other, and the at least two outer isolation components 32 are located between the light transmissive region 20 and the barrier wall structure. The groove structure includes a second groove structure 48 located between the at least two outer isolation components 32 and the barrier wall structure.

Illustratively, in a direction perpendicular to the base, the height of the outer isolation components ranges from 5000 Å to 10000 Å, inclusive.

Illustratively, each outer isolation components 32 surrounds the light transmissive region 20.

Illustratively, the second groove structure 48 is located between an entire structure including the at least two outer isolation components 32 and the barrier wall structure.

Illustratively, the width of the second groove is less than the distance between the entire structure including the at least two outer isolation components 32 and the barrier wall structure.

Illustratively, the width of the second groove ranges from 10 μm to 20 μm, inclusive, and may be, for example, 12 μm, 14 μm, 16 μm, or 18 μm, etc.

Illustratively, the depth of the second groove ranges from 5000 Å to 10000 Å, inclusive, and may be, for example, 6000 Å, 7000 Å, 8000 Å, or 9000 Å, etc.

A cutting separation region 50 may be provided between the at least two outer isolation components 32 and the light transmissive region 20, so as to prevent the heat generated by cutting during the process of cutting to form the light transmissive region 20 from affecting the outer isolation components 32 and the barrier wall structure, etc.

Illustratively, the quantity of the outer isolation components 32 may be two or more, for example, five, such that the outer isolation components 32 may be located in the cutting separation region 50, which may also mitigate the adverse effect due to the heat generated by cutting.

In the display substrate provided in the above-mentioned embodiment, by arranging the groove structure to include the second groove structure 48 located between the at least two outer isolation components 32 and the barrier wall structure, the organic encapsulation material may flow into the second groove structure 48 after overflowing out of the barrier wall structure, thereby effectively preventing the organic encapsulation material from further flowing towards the light transmissive region 20 after overflowing out of the barrier wall structure. In this way, the reliability of the display substrate can be ensured.

It is to be noted that both the first groove structure 43 and the second groove structure 48 may be provided in the display substrate, so as to further improve the reliability of the display substrate. Alternatively, only one of the first groove structure 43 and the second groove structure 48 may be provided. Illustratively, the first groove structure 43 and the second groove structure 48 may enclose the light transmissive regions 20.

In some embodiments, a first groove structure may also be provided between two adjacent inner isolation components 31, such that the first groove structures are provided at both sides of the inner isolation component 31, which is more advantageous for preventing the organic encapsulation material from overflowing. Similarly, a second groove structure may also be provided between two adjacent outer isolation components 32, such that the second groove structures are provided at both sides of the outer isolation component 32.

Figure 9:
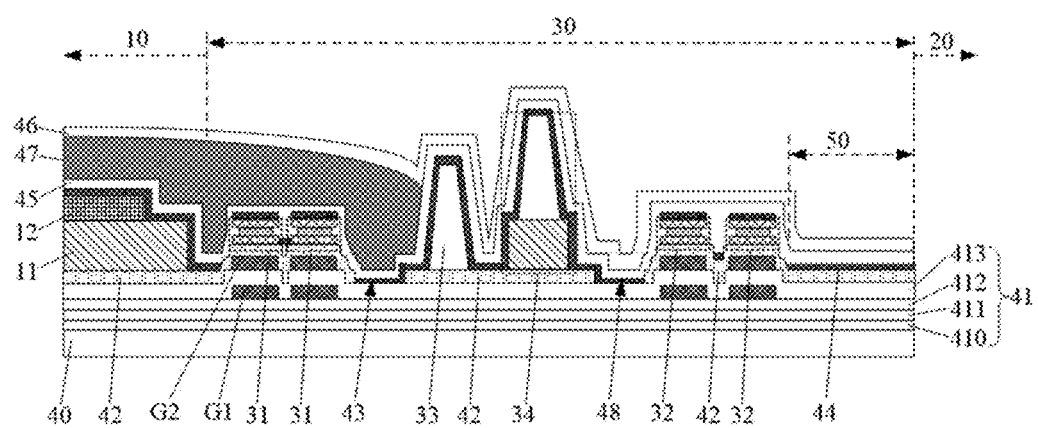
FIG. 9 is an eighth schematic cross-sectional view in the direction A1-A2 in FIG. 1.

In some embodiments, a metal underlayer may be provided directly below the inner isolation components 31 and/or the outer isolation components 32, and illustratively, the metal underlayer includes one or more of a light shielding metal pattern, a first gate metal pattern G1, a second gate metal pattern G2, and a third gate metal pattern. As shown in FIG. 9, a case in which the metal underlayer includes the first gate metal pattern G1 and the second gate metal pattern G2 is illustratively shown in FIG. 9.

It is to be noted that the light shielding metal pattern, the first gate metal pattern G1, the second gate metal pattern G2, and the third gate metal pattern are sequentially arranged in a stack in a direction away from the base 40.

By providing the metal underlayer directly below the inner isolation component 31 and/or the outer isolation component 32, the height of the inner isolation component 31 and/or that of the outer isolation component 32 can be increased, thereby better ensuring that the light-emitting functional layer 44 is disconnected at the side face(s) of the inner isolation component 31 and/or the outer isolation component 32.

As shown in FIG. 9, the film layer 41 includes a blocking layer 410, a buffer layer 411, a first gate insulating layer 412, and a second gate insulating layer 413. Each of the blocking layer 410, the buffer layer 411, the first gate insulating layer 412 and the second gate insulating layer 413 may be made of an inorganic material such as silicon nitride and silicon oxide. When the blocking layer 410, the buffer layer 411, the first gate insulating layer 412, the second gate insulating layer 413 and the interlayer insulating layer are all made of the same material, there is no obvious boundary between any two adjacent film layers.

Illustratively, the thickness of the blocking layer 410 may be in a range of 4000 Å to 6000 Å, and may be, for example, 4500 Å, 5000 Å, or 5500 Å, etc. The thickness of the buffer layer 411 is in a range of 3000 Å to 5000 Å, and may be, for example, 3500 Å, 4000 Å, or 4500 Å, etc. The thickness of the first gate insulating layer 412 is in a range of 800 Å to 1500 Å. The thickness of the second gate insulating layer 413 is in a range of 1000 Å to 1500 Å, and may be, for example, 1100 Å, 1200 Å, 1300 Å, or 1400 Å, etc. The thickness of the interlayer insulating layer is in a range of 4000 Å to 6000 Å, and may be, for example, 4500 Å, 5000 Å, or 5500 Å, etc.

In some embodiments, a side face of an inner isolation component 31 included in the isolation component has a recess, and/or a side face of an outer isolation component 32 has a recess.

Specifically, the display substrate includes a first source-drain metal layer, and the first source-drain metal layer is for forming the source electrode and drain electrode of the transistor in the display substrate, and for forming some conductive connection portions. Illustratively, the isolation component is arranged in the same layer and made of the same material as the first source-drain metal layer.

Illustratively, the inner isolation component 31 and the outer isolation component 32 may be provided to have a cross section of an I-shape (as shown in FIG. 9) or a T-shape in a direction perpendicular to the base 40.

Illustratively, the first source-drain metal layer includes a first titanium metal layer, an aluminum metal layer, and a second titanium metal layer which are arranged in a stack, and the isolation component also includes these three layers.

In the display substrate provided by the embodiment described above, by arranging a recess at the side face of the inner isolation component 31 and/or that of the outer isolation component 32, the portion of the light-emitting functional layer 44 extending to the isolation region 30 can be disconnected at the recess in the side face of the inner isolation component 31 and/or that of the outer isolation component 32, thereby addressing the following issue: the water and oxygen may enter the interior of the display substrate along the light-emitting functional layer 44 at the cut line at the boundary of the light transmissive region 20, which may etch the interior of the display substrate, and result in a display failure.

Figure 3:
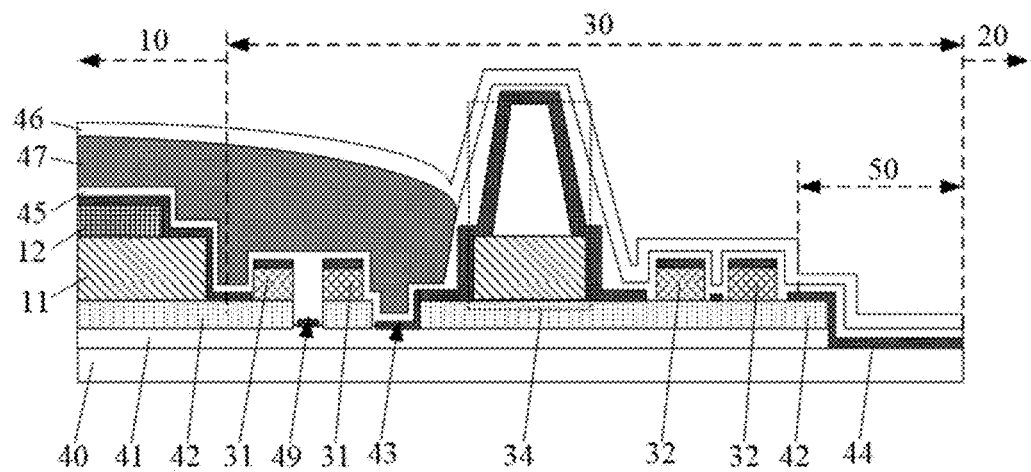
FIG. 3 is a second schematic cross-sectional view taken along the direction A1-A2 in FIG. 1.
Figure 4:
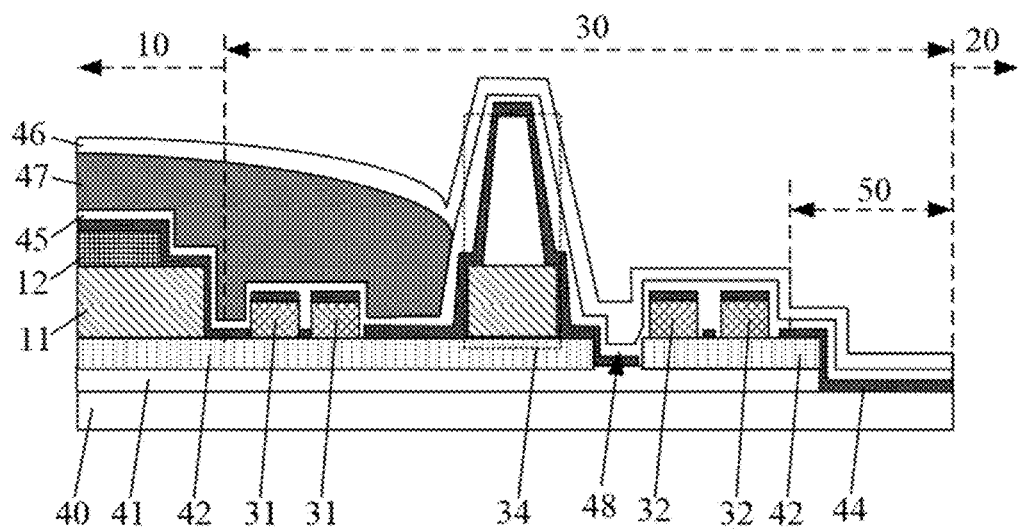
FIG. 4 is a third schematic cross-sectional view taken along the direction A1-A2 in FIG. 1.
Figure 5:
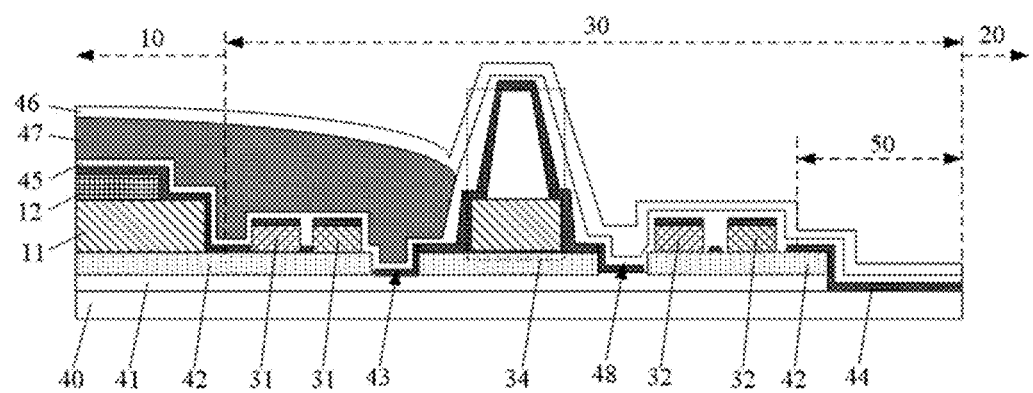
FIG. 5 is a fourth schematic cross-sectional view taken along the direction A1-A2 in FIG. 1.

As shown in FIG. 3, in some embodiments, the display substrate includes an interlayer insulating layer 42, and the interlayer insulating layer 42 is located between the isolation component and the base 40 of the display substrate: the interlayer insulating layer 42 is provided with a channel 49, and an orthographic projection of the channel 49 onto the base 40 is located between orthographic projections of two adjacent outer isolation components 32 onto the base 40; and/or, in a case that the isolation component includes at least two inner isolation components 31, the orthographic projection of the channel 49 onto the base 40 is located between orthographic projections of two adjacent inner isolation components 31 onto the base 40.

Specifically, a surface of the interlayer insulating layer 42 facing away from the base 40 is provided with the channel 49, illustratively, the channel 49 surrounds the light transmissive region 20, and the depth of the interlayer insulating layer 42 in a direction perpendicular to the base 40 is greater than or equal to the thickness of the interlayer insulating layer 42.

In the display substrate provided in the above-mentioned embodiment, By providing the channel 49 between the adjacent inner isolation components 31 (or outer isolation components 32), the height of the segment difference between a surface of the inner isolation component 31 (or outer isolation component 32) facing away from the base 40 and the base 40 can be increased, so that the portion of the light-emitting functional layer 44 extending to the isolation region 30 can be broken at the recess at the side face of the inner isolation component 31 (or outer isolation component 32) more easily, thereby better addressing the following issue: the water and oxygen may enter the interior of the display substrate along the light-emitting functional layer 44 at the cut line at the boundary of the light transmissive region 20, which may etch the interior of the display substrate, and result in a display failure.

In some embodiments, the isolation region 30 is provided with a first gate insulating layer, a second gate insulating layer and an interlayer insulating layer 42 which are sequentially arranged in a stack in the direction away from the base 40 of the display substrate. In the direction perpendicular to the base 40, the depth of the groove structure is greater than or equal to the thickness of the interlayer insulating layer 42.

Specifically, the isolation region 30 is provided with a blocking layer, a buffer layer, a first gate insulating layer, a second gate insulating layer and an interlayer insulating layer 42 which are sequentially arranged in a stack in the direction away from the base 40 of the display substrate. It is to be noted that the film layer 41 in FIGS. 2 to 8 includes the blocking layer, the buffer layer, the first gate insulating layer, and the second gate insulating layer.

In the direction perpendicular to the base 40, the depth of the first groove structure 43 and the depth of the second groove structure 48 are greater than or equal to the thickness of the interlayer insulating layer 42.

In a particular implementation, the depth of the first groove structure 43 and/or the depth of the second groove structure 48 are substantially equal to the thickness of the interlayer insulating layer.

In a particular implementation, the depth of the first groove structure 43 and/or the depth of the second groove structure 48 are substantially equal to the sum of the thicknesses of the interlayer insulating layer and the thicknesses of the second gate insulating layer.

In a particular implementation, the depth of the first groove structure 43 and/or the depth of the second groove structure 48 are substantially equal to the sum of the thicknesses of the interlayer insulating layer, the thicknesses of the second gate insulating layer and the thicknesses of the first gate insulating layer.

It is to be noted that the term "substantially" used in the embodiments of the present disclosure means that the thickness varies no more than 20%, for example, less than 15%, 10%, or 5%, etc.

By arranging the groove structure to have a depth greater than or equal to the thickness of the interlayer insulating layer 42 in the direction perpendicular to the base 40, the groove structure can have a larger capacity, thereby better preventing the organic encapsulation material from overflowing to the light transmissive region 20.

Figure 7:
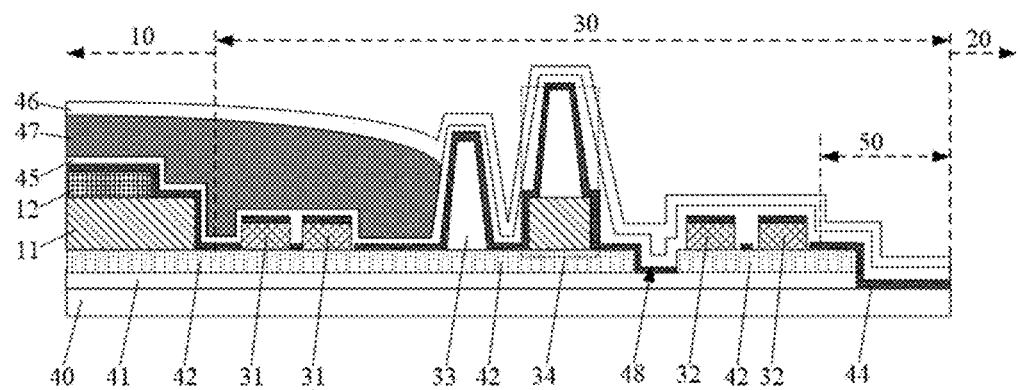
FIG. 7 is a sixth schematic cross-sectional view taken along the direction A1-A2 in FIG. 1.
Figure 8:
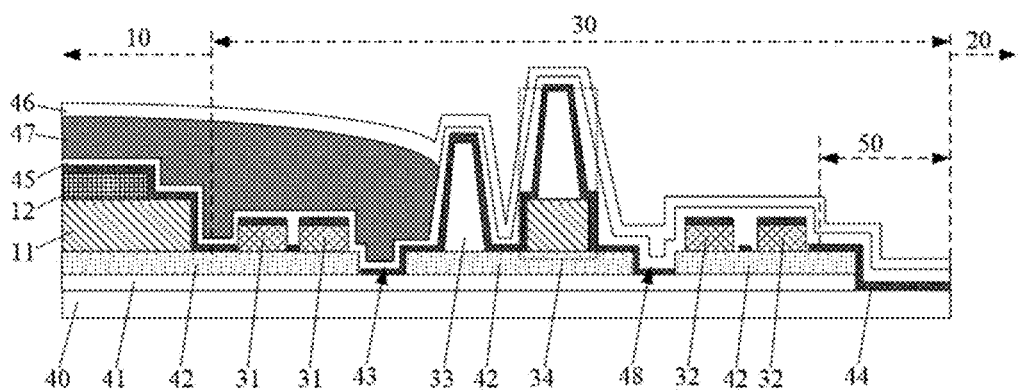
FIG. 8 is a seventh schematic cross-sectional view taken along the direction A1-A2 in FIG. 1.

As shown in FIGS. 6 to 8, in some embodiments, the barrier wall structure includes a first barrier wall component 33 and a second barrier wall component 34 disposed sequentially along the direction from the pixel region 10 pointing towards the light transmissive region 20, a height of a surface of the first barrier wall component 33 facing away from the base 40 of the display substrate is lower than a height of a surface of the second barrier wall component 34 facing away from the base 40.

Specifically, the barrier wall structure may be in any of various specific structures, and illustratively, the barrier wall structure includes a plurality of barrier wall components sequentially arranged along a direction approaching the light transmissive region 20, and the heights of the barrier wall components in the direction perpendicular to the base 40 increments gradually in the direction approaching the light transmissive region 20.

Illustratively, in the direction perpendicular to the base, the heights of the first barrier wall component 33 and the second barrier wall component 34 range from 3 μm to 10 μm, inclusive, and may be, for example, 4 μm, 5 μm, 6 μm, 7 μm, 8 μm, or 9 μm, etc.

Illustratively, the barrier wall structure may be configured to include the first barrier wall component 33 and the second barrier wall component 34 arranged sequentially along the direction approaching the light transmissive region 20, and both the first barrier wall component 33 and the second barrier wall component 34 can enclose the light transmissive region 20. When the barrier wall structure of the above-mentioned structure is provided in the display substrate, an effective blocking of the organic encapsulation layer 47 can be achieved, and in addition, the barrier wall structure can only occupy a smaller layout space.

As shown in FIGS. 6 to 8, in some embodiments, the pixel region 10 is provided with a planarization layer 11, a pixel definition layer 12 and a spacer layer which are sequentially arranged in a stack in a direction away from the base 40;

the first barrier wall component 33 includes a first barrier wall pattern and a second barrier wall pattern which are sequentially arranged in a stack in a direction away from the base 40, the first barrier wall pattern is arranged in the same layer and made of the same material as the pixel definition layer 12, and the second barrier wall pattern is arranged in the same layer and made of the same material as the spacer layer; and the second barrier wall component 34 includes a third barrier wall pattern, a fourth barrier wall pattern and a fifth barrier wall pattern which are sequentially arranged in a stack in a direction away from the base 40, the third barrier wall pattern is arranged in the same layer and made of the same material as the planarization layer 11, the fourth barrier wall pattern is arranged in the same layer and made of the same material as the pixel definition layer 12, and the fifth barrier wall pattern is arranged in the same layer and made of the same material as the spacer layer.

Specifically, the pixel region 10 is provided with a driver circuit layer, the planarization layer 11 on a side of the driver circuit layer facing away from the base 40, an anode layer on a side of the planarization layer 11 facing away from the base 40, the pixel definition layer 12 on a side of the anode layer facing away from the base 40, and the spacer layer on a side of the pixel definition layer 12 facing away from the base 40. The pixel definition layer 12 is for forming pixel openings in the pixel region 10; and the spacer is located on the side of the pixel definition layer 12 facing away from the base 40 and serves as a supporting function in the display substrate.

In more detail, the driver circuit layer includes a plurality of sub-pixel driver circuits, the anode layer includes anode patterns that are in one-to-one correspondence to the sub-pixel driver circuits, the pixel definition layer defines pixel openings that are in one-to-one correspondence to the anode patterns, an orthographic projection of each pixel opening onto the base 40 is surrounded by an orthographic projection of a corresponding anode pattern onto the base 40, and an organic light-emitting material layer in a corresponding color is provided in each pixel opening.

With the first barrier wall pattern being arranged in the same layer and made of the same material as the pixel definition layer 12, and the second barrier wall pattern being arranged in the same layer and made of the same material as the spacer layer, the first barrier wall pattern and the pixel definition layer 12 can be formed in the same single patterning process, and the second barrier wall pattern and the spacer layer can be formed in the same single patterning process, thereby simplifying the manufacturing process of the display substrate and saving manufacturing costs.

With the third barrier wall pattern being arranged in the same layer and made of the same material as the planarization layer 11, the fourth barrier wall pattern being arranged in the same layer and made of the same material as the pixel definition layer 12, and the fifth barrier wall pattern being arranged in the same layer and made of the same material as the spacer layer, the third barrier wall pattern and the planarization layer 11 can be formed in the same single patterning process, the fourth barrier wall pattern and the pixel definition layer 12 can be formed in the same single patterning process, and the fifth barrier wall pattern and the spacer layer can be formed in the same single patterning process, thereby simplifying the manufacturing process of the display substrate and saving manufacturing costs.

It is to be noted that when the barrier wall structure includes the first barrier wall component 33 and the second barrier wall component 34, the display substrate may include the outer isolation component(s) 32 and the inner isolation component(s) 31, and may also include the first groove structure 43 and/or the second groove structure 48.

When the barrier wall structure includes the first barrier wall component 33 and the second barrier wall component 34, a better blocking for the organic encapsulation material can be achieved. It is ensured that a better encapsulating effect by the first inorganic encapsulation layer 45 and the second inorganic encapsulation layer 46 at the side of the barrier wall structure near the light transmissive region 20, and thus, a better reliability of the display substrate.

As shown in FIGS. 2 to 5 and 9, in some embodiments, the pixel region 10 is provided with a planarization layer 11, a pixel definition layer 12 and a spacer layer which are sequentially arranged in a stack in a direction away from the base 40 of the display substrate; and the barrier wall structure includes a second barrier wall component 34, the second barrier wall component 34 includes a third barrier wall pattern, a fourth barrier wall pattern and a fifth barrier wall pattern which are sequentially arranged in a stack in a direction away from the base 40, the third barrier wall pattern is arranged in the same layer and made of the same material as the planarization layer 11, the fourth barrier wall pattern is arranged in the same layer and made of the same material as the pixel definition layer 12, and the fifth barrier wall pattern is arranged in the same layer and made of the same material as the spacer layer.

Specifically, When the barrier wall structure includes only the second barrier wall component 34, the display substrate may include the outer isolation component(s) 32 and the inner isolation component(s) 31, and may also include the first groove structure 43 and/or the second groove structure 48.

When the barrier wall structure includes only the second barrier wall component 34, the frame width of the display substrate at the isolation region 30 can be effectively reduced, and a narrow frame design of the display substrate in the vicinity of the light transmissive region 20 can be achieved.

In some embodiments, in a direction perpendicular to the base of the display substrate, a ratio of a depth of the groove structure to a height of the isolation component is ranges from 0.5 to 1.

Illustratively, in the direction perpendicular to the base of the display substrate, the first groove structure 43 has substantially the same depth as the second groove structure 48, and the inner isolation component 31 has substantially the same height as the outer isolation component 32.

An embodiment of the present disclosure further provides a display device, including the display substrate described above.

In the display substrate provided by embodiments of the present disclosure, the portion of the light-emitting functional layer 44 extending to the isolation region 30 is disconnected at side face(s) of the isolation component, thereby preventing the water and oxygen from entering into the interior of the display substrate along the light-emitting functional layer 44. Furthermore, in the display substrate provided by embodiments of the present disclosure, the barrier wall structure can block the organic encapsulation material for forming the organic encapsulation layer 47 when forming the organic encapsulation layer 47. In addition, when the groove structure is located at a side of the barrier structure near the pixel region 10, the groove structure can accommodate a part of the organic encapsulation material, and when the groove structure is located at a side of the barrier structure near the light transmissive region 20, the groove structure can accommodate a part of overflowed organic encapsulation material if the organic encapsulation material overflows from the barrier structure. Therefore, in the display substrate provided by embodiments of the present disclosure, by providing the groove structure and the barrier structure in the isolation region 30, both the groove structure and the barrier wall structure can effectively limit the extension of the organic encapsulation layer 47 towards the light transmissive region 20, thereby limiting an boundary of the organic encapsulation layer 47 within the isolation region 30. This can address the following issue: the organic encapsulation material may easily overflow from the barrier structure to the light transmissive region 20 when performing the thin film encapsulation, which may affect the reliability of the display product.

Therefore, the display device provided by this embodiment also has the above-described advantageous effects when including the above-described display substrate, and the description thereof will not be repeated here.

It is to be noted that the display device may be a television, a display, a digital photo frame, a mobile phone, a tablet computer, or any product or component with a display function.

An embodiment of the present disclosure further provides a method for manufacturing a display substrate, which is used for manufacturing the display substrate provided in the above embodiments, the display substrate including a display area, the display area including a pixel region 10, a light transmissive region 20, and an isolation region 30 located between the pixel region 10 and the light transmissive region 20, the isolation region 30 at least partially surrounding the light transmissive region 20; the method includes:

fabricating, in the isolation region 30, an isolation component, a barrier wall structure, and a groove structure located between the isolation component and the barrier wall structure:

fabricating a light-emitting functional layer 44 and an organic encapsulation layer 47 in the pixel region 10; where a portion of the light-emitting functional layer 44 extending to the isolation region 30 is disconnected at a side face of the isolation component: the organic encapsulation layer 47 extends from the pixel region 10 to the isolation region 30, and the groove structure and the barrier wall structure are configured for limiting the organic encapsulation layer 47 from extending to the light transmissive region 20.

In the display substrate manufactured by the manufacturing method provided by the embodiments of the present disclosure, the portion of the light-emitting functional layer 44 extending to the isolation region 30 is disconnected at side face(s) of the isolation component, thereby preventing the water and oxygen from entering into the interior of the display substrate along the light-emitting functional layer 44. Furthermore, in the display substrate provided by embodiments of the present disclosure, the barrier wall structure can block the organic encapsulation material for forming the organic encapsulation layer 47 when forming the organic encapsulation layer 47. In addition, when the groove structure is located at a side of the barrier structure near the pixel region 10, the groove structure can accommodate a part of the organic encapsulation material, and when the groove structure is located at a side of the barrier structure near the light transmissive region 20, the groove structure can accommodate a part of overflowed organic encapsulation material if the organic encapsulation material overflows from the barrier structure. Therefore, in the display substrate manufactured by the manufacturing method provided by the embodiments of the present disclosure, by providing the groove structure and the barrier structure in the isolation region 30, both the groove structure and the barrier wall structure can effectively limit the extension of the organic encapsulation layer 47 towards the light transmissive region 20, thereby limiting an boundary of the organic encapsulation layer 47 within the isolation region 30. This can address the following issue: the organic encapsulation material may easily overflow from the barrier structure to the light transmissive region 20 when performing the thin film encapsulation, which may affect the reliability of the display product.

In some embodiments, the pixel region 10 is provided with a planarization layer 11, a pixel definition layer 12 and a spacer layer which are sequentially arranged in a stack in a direction away from the base 40 of the display substrate; and the barrier wall structure includes a second barrier wall component 34, and the second barrier wall component 34 includes a third barrier wall pattern, a fourth barrier wall pattern and a fifth barrier wall pattern which are sequentially arranged in a stack in a direction away from the base 40; and the manufacturing method includes a step of fabricating the second barrier wall component 34, including:

forming, in a single patterning process, the third barrier wall pattern and the planarization layer 11 simultaneously:

forming, in a single patterning process, the fourth barrier wall pattern and the pixel definition layer 12 simultaneously; and forming, in a single patterning process, the fifth barrier wall pattern and the spacer layer simultaneously.

When the display substrate is manufactured using the manufacturing method provided in the above-mentioned embodiment, the third barrier wall pattern can be formed in the same single patterning process as the planarization layer 11, the fourth barrier wall pattern can be formed in the same single patterning process as the pixel definition layer 12, and the fifth barrier wall pattern can be formed in the same single patterning process as the spacer layer, thereby simplifying the manufacturing process of the display substrate and saving manufacturing costs.

It should be noted that the various embodiments described herein are described in a progressive manner, the same or similar parts throughout the various embodiments can be referred to each other, with each embodiment focusing on the differences from the other embodiments. In particular, the method embodiments are described more simply because they are substantially similar to the product embodiments, and the related part can be referred to the description for the product embodiments.

Unless defined otherwise, technical or scientific terms used in this disclosure shall have the ordinary meaning as understood by one of ordinary skill in the art to which this disclosure belongs. The terms "first", "second", and the like as use herein do not denote any order, quantity, or importance, but rather are used to distinguish one element from another. The terms "include" or "comprise", and the like, means that an element or item preceding the word encompasses an element or item listed after the word and equivalents thereof, but does not exclude other elements or items. The terms "connect", "couple" or "link" and the like are not limited to physical or mechanical connections, but may include electrical connections, whether direct or indirect. The terms "upper", "lower", "left", "right" and the like are used only to indicate relative position relationships that may change accordingly when the absolute position of the object being described changes.

It will be understood that when an element such as a layer, film, region or substrate is referred to as being "on" or "under" another element, it can be "directly on" or "directly under" the other element or there may be an intervening element.

In the description of the embodiments above, particular features, structures, materials, or characteristics may be combined in any suitable manner in any one or more embodiments or examples.

The foregoing are only specific embodiments of the present disclosure, it will be understood that various changes and substitutions, which may be readily conceived by those skilled in the art without departing from the scope of the disclosure, fall within the scope of the disclosure. Accordingly, the protection scope of the present disclosure is set forth in the appended claims.

What is claimed is:

1. A display substrate, comprising a display area, the display area comprising a pixel region, a light transmissive region, and an isolation region located between the pixel region and the light transmissive region, the isolation region at least partially surrounding the light transmissive region;
    wherein the isolation region comprises an isolation component, a barrier wall structure, and a groove structure located between the isolation component and the barrier wall structure;
    the pixel region comprises a light-emitting functional layer and an organic encapsulation layer; a portion of the light-emitting functional layer extending to the isolation region is disconnected at a side face of the isolation component; and the organic encapsulation layer extends from the pixel region to the isolation region, and the groove structure and the barrier wall structure are configured for limiting an extension of the organic encapsulation layer towards the light transmissive region;
    wherein the isolation region is provided with a first gate insulating layer, a second gate insulating layer and an interlayer insulating layer which are sequentially arranged in a direction away from a base of the display substrate, and the interlayer insulating layer is located between the isolation component and the base of the display substrate;
    wherein the isolation component comprises at least two inner isolation components, the at least two inner isolation components are arranged at an interval in a direction from the pixel region towards the light transmissive region, and the at least two inner isolation components are located between the pixel region and the barrier wall structure; a channel is arranged between two adjacent inner isolation components, and the channel penetrates the interlayer insulating layer; and
    the groove structure comprises a first groove structure located between the at least two inner isolation components and the barrier wall structure, the first groove structure penetrates the interlayer insulating layer, and the organic encapsulation layer is filled in the first groove structure.

2. The display substrate according to claim 1, wherein the isolation component includes at least two outer isolation components, the at least two outer isolation components are arranged at an interval in a direction from the pixel region towards the light transmissive region, and the at least two outer isolation components are located between the light transmissive region and the barrier wall structure; and
    the groove structure includes a second groove structure located between the at least two outer isolation components and the barrier wall structure.

3. The display substrate according to claim 2, wherein a side face of an inner isolation component included in the isolation component has a recess.

4. The display substrate according to claim 2, wherein the interlayer insulating layer is provided with a second channel, and an orthographic projection of the second channel onto the base is located between orthographic projections of two adjacent outer isolation components onto the base.

5. The display substrate according to claim 2, wherein a side face of the outer isolation component has a recess.

6. The display substrate according to claim 1, wherein the barrier wall structure comprises a first barrier wall component and a second barrier wall component arranged sequentially along a direction from the pixel region towards the light transmissive region, a height of a surface of the first barrier wall component facing away from a base of the display substrate is lower than a height of a surface of the second barrier wall component facing away from the base.

7. The display substrate according to claim 6, wherein the pixel region is provided with a planarization layer, a pixel definition layer and a spacer layer which are sequentially arranged in a stack in a direction away from the base;
    the first barrier wall component comprises a first barrier wall pattern and a second barrier wall pattern which are sequentially arranged in a stack in the direction away from the base, the first barrier wall pattern is arranged in the same layer and made of the same material as the pixel definition layer, and the second barrier wall pattern is arranged in the same layer and made of the same material as the spacer layer; and
    the second barrier wall component comprises a third barrier wall pattern, a fourth barrier wall pattern and a fifth barrier wall pattern which are sequentially arranged in a stack in the direction away from the base, the third barrier wall pattern is arranged in the same layer and made of the same material as the planarization layer, the fourth barrier wall pattern is arranged in the same layer and made of the same material as the pixel definition layer, and the fifth barrier wall pattern is arranged in the same layer and made of the same material as the spacer layer.

8. The display substrate according to claim 1, wherein the pixel region is provided with a planarization layer, a pixel definition layer and a spacer layer which are sequentially arranged in a stack in a direction away from a base of the display substrate; and
    the barrier wall structure comprises a second barrier wall component, the second barrier wall component comprises a third barrier wall pattern, a fourth barrier wall pattern and a fifth barrier wall pattern which are sequentially arranged in a stack in the direction away from the base, the third barrier wall pattern is arranged in the same layer and made of the same material as the planarization layer, the fourth barrier wall pattern is arranged in the same layer and made of the same material as the pixel definition layer, and the fifth barrier wall pattern is arranged in the same layer and made of the same material as the spacer layer.

9. The display substrate according to claim 1, wherein the groove structure encloses the light transmissive region.

10. The display substrate according to claim 1, wherein in a direction perpendicular to a base of the display substrate, a ratio of a depth of the groove structure to a height of the isolation component is in a range between 0.5 and 1.

11. A display device, comprising the display substrate according to claim 1.

12. A method for manufacturing a display substrate, the display substrate comprising a display area, the display area comprising a pixel region, a light transmissive region, and an isolation region located between the pixel region and the light transmissive region, the isolation region at least partially surrounding the light transmissive region; the method comprising:

fabricating, in the isolation region, an isolation component, a barrier wall structure, and a groove structure which is located between the isolation component and the barrier wall structure;

fabricating a light-emitting functional layer and an organic encapsulation layer in the pixel region; wherein a portion of the light-emitting functional layer extending to the isolation region is disconnected at a side face of the isolation component; the organic encapsulation layer extends from the pixel region to the isolation region, and the groove structure and the barrier wall structure are configured for limiting an extension of the organic encapsulation layer towards the light transmissive region;

wherein the isolation region is provided with a first gate insulating layer, a second gate insulating layer and an interlayer insulating layer which are sequentially arranged in a direction away from a base of the display substrate, and the interlayer insulating layer is located between the isolation component and the base of the display substrate;

wherein the isolation component comprises at least two inner isolation components, the at least two inner isolation components are arranged at an interval in a direction from the pixel region towards the light transmissive region, and the at least two inner isolation components are located between the pixel region and the barrier wall structure; a channel is arranged between two adjacent inner isolation components, and the channel penetrates the interlayer insulating layer;

the groove structure comprises a first groove structure located between the at least two inner isolation components and the barrier wall structure, the first groove structure penetrates the interlayer insulating layer, and the organic encapsulation layer is filled in the first groove structure.

13. The method according to claim 12, wherein the pixel region is provided with a planarization layer, a pixel definition layer and a spacer layer which are sequentially arranged in a stack in a direction away from a base of the display substrate; the barrier wall structure comprises a second barrier wall component, and the second barrier wall component comprises a third barrier wall pattern, a fourth barrier wall pattern and a fifth barrier wall pattern which are sequentially arranged in a stack in the direction away from the base; and the method comprises a step of fabricating the second barrier wall component, comprising:

forming, in a single patterning process, the third barrier wall pattern and the planarization layer simultaneously;

forming, in a single patterning process, the fourth barrier wall pattern and the pixel definition layer simultaneously; and forming, in a single patterning process, the fifth barrier wall pattern and the spacer layer simultaneously.

\* \* \* \* \*